(12) United States Patent
Ohuchi et al.

(10) Patent No.: US 6,204,563 B1
(45) Date of Patent: Mar. 20, 2001

(54) SEMICONDUCTOR DEVICE

(75) Inventors: Shinji Ohuchi; Noritaka Anzai; Yoshimi Egawa, all of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/192,595

(22) Filed: Nov. 17, 1998

(30) Foreign Application Priority Data

Jan. 19, 1998 (JP) .................................................. 10-007320

(51) Int. Cl.$^7$ ........................... H01L 23/98; H01L 23/52; H01L 29/40
(52) U.S. Cl. ......................... 257/778; 257/781; 257/705; 257/698; 257/708; 257/795; 257/780
(58) Field of Search ..................................... 257/778, 781, 257/698, 705, 708, 735, 780; 438/108, 612

(56) References Cited

U.S. PATENT DOCUMENTS 4,825,284 * 4/1989 Soga et al. .............................. 357/80
5,998,861 * 12/1999 Hiruta ................................... 257/700

* cited by examiner

Primary Examiner—Minh Loan Tran
Assistant Examiner—Luan Thai
(74) Attorney, Agent, or Firm—Jones Volentine, LLC

(57) ABSTRACT

A semiconductor device for mounting on an external substrate includes a semiconductor chip, a high thermal elastic internal substrate and a high elastic liquid resin. The semiconductor chip has bump electrodes formed on its main surface. The high thermal elastic internal substrate includes a conductive pattern on one surface and external electrodes on the other surface. The conductive pattern is electrically connected to the bump electrodes. The external electrodes are electrically connected to the conductive pattern and mounted on the external substrate. The high elastic liquid resin covers the surface of the semiconductor chip, the one surface of the internal substrate and the bump electrodes. The internal substrate has a Young modulus of about 8000 to 15000 kg/mm$^2$, which is larger than a Young modulus of the external substrate.

27 Claims, 4 Drawing Sheets

FIG. 6

| | External Connection | Internal Connection | |
|---|---|---|---|
| | | Conventional Resin Young's Modulus 500kg/mm² | High Elastic Liquid Resin Young's Modulus 2000kg/mm² |
| External Substrate Young's Modulus 3000kg/mm² Thermal Expansion Coefficient 15ppm | — | | |
| Ceramic Young's Modulus 20000kg/mm² Thermal Expansion Coefficient 5ppm | ✕ 400 CYCLES | ○ 1200 CYCLES | ○ 1200 CYCLES |
| High Thermal Plastic Ceramic Young's Modulus 10000kg/mm² Thermal Expansion Coefficient 10ppm | ○ 1000 CYCLES | △ 800 CYCLES | ○ 1200 CYCLES |
| Polyimide Tape/Plastic Young's Modulus 3000kg/mm² Thermal Expansion Coefficient 15ppm | ✕ 500 CYCLES | ✕ 400 CYCLES | ✕ 400 CYCLES |
| | | First Embodiment | Second Embodiment |

SEMICONDUCTOR DEVICE

BACKGROUND OF THE INVENTION

1. Field of the Invention

This invention relates to a structure of a semiconductor device, and particularly to a substrate package having an internal substrate.

2. Description of the Related Art

Portable devices have rapidly been widespread in recent years. According to their widespread use, plastic molded type semiconductor devices mounted in the portable devices also need ones brought into less thickness, size and weight at present. Many types of packages have been proposed to cope with these.

There is known, as one example thereof, one wherein a semiconductor element or elemental device provided with bumps on a circuit forming surface is provided so that the bumps are joined to conductive pattern portions of an internal substrate with conductive patterns formed on its surface, a gap or clearance defined between these is charged with a resin, and solder balls for connection of an external substrate are provided on the back of the internal substrate.

SUMMARY OF THE INVENTION

With the foregoing in view, it is therefore an object of the present invention to reduce cracks produced in solder balls by a thermal shock like a temperature cycle after the placement of an external substrate.

According to one aspect of this invention, for achieving the above object, there is provided a semiconductor device, comprising:

a semiconductor element provided with a plurality of protruded electrodes on the surface thereof; and an internal substrate having one surface on which conductive patterns electrically connected to the protruded electrodes are formed, and the other surface opposite to one surface thereof, on which external electrodes providing continuity of the conductive patterns via through holes are formed. The internal substrate has a thermal expansion coefficient having a value in the neighborhood of a thermal expansion coefficient of an external substrate and has a Young's modulus larger than that of the external substrate.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

FIG. 6 is a diagram showing temperature cycles employed in the embodiments of the present invention.

DETAILED DESCRIPTION OF THE PREFERRED EMBODIMENTS

Figure 1:
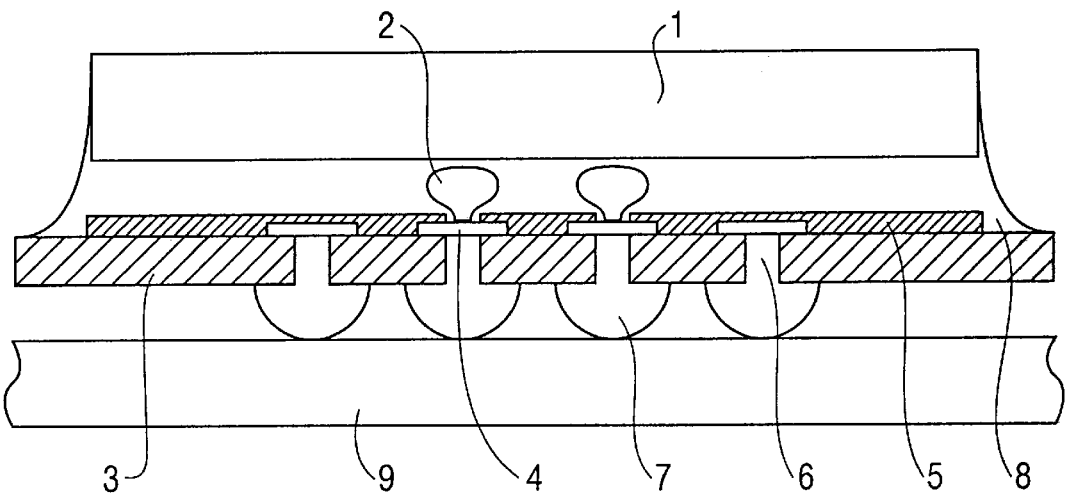
FIG. 1 is a diagram showing a first embodiment of the present invention.

Preferred embodiments of the present invention will hereinafter be described with reference to the accompanying drawings. In all the drawings used to describe the embodiments, parts each having the same function are identified by the same reference numerals and their description will be omitted.

FIG. 1 is a diagram for describing a first embodiment of the invention of the present application. In a semiconductor device according to the first embodiment, bump electrodes 2 formed over a circuit forming surface of a semiconductor elemental device or element 1 used as a semiconductor substrate and conductive patterns 4 composed of copper or the like, which are formed over the surface of an internal substrate 3, are respectively electrically connected to one another. Each conductive pattern is covered with an insulative layer 5 except for portions electrically connected to the bump electrodes 2. A spacing between the semiconductor element 1 and the internal substrate 3 is charged with a resin 8. After the resin 8 has been injected therein and cured, solder balls 7 are formed in the back of the internal substrate 3. The solder balls 7 are electrically connected to their corresponding conductive patterns 4 via through holes 6. Thereafter, the semiconductor device is mounted on an external substrate 9 and the external substrate 9 and the solder balls 7 are joined to each other.

Now, a material whose Young's modulus ranges from about 8000 to 15000 kg/mm$^2$, i.e., which is hard to some degree, and whose coefficient of thermal expansion ranges from about 10 to 12 ppm corresponding to values near or close to the thermal expansion coefficient of the external substrate, is used as the material for the internal substrate 3. High thermal expansive ceramic or the like produced by Kyocera, Corporation can be used as an example.

In general, the external substrate 9 electrically connected to the solder balls 7 has a Young's modulus of 3000 kg/mm$^2$ and a thermal expansion coefficient of 15 ppm.

Thus semiconductor element 1 normally has a Young's modulus of about 13000 kg/mm$^2$, a thermal expansion coefficient of about 3 ppm, one side of 10 mm×10 mm and a thickness of about 300 μm.

Figure 2:
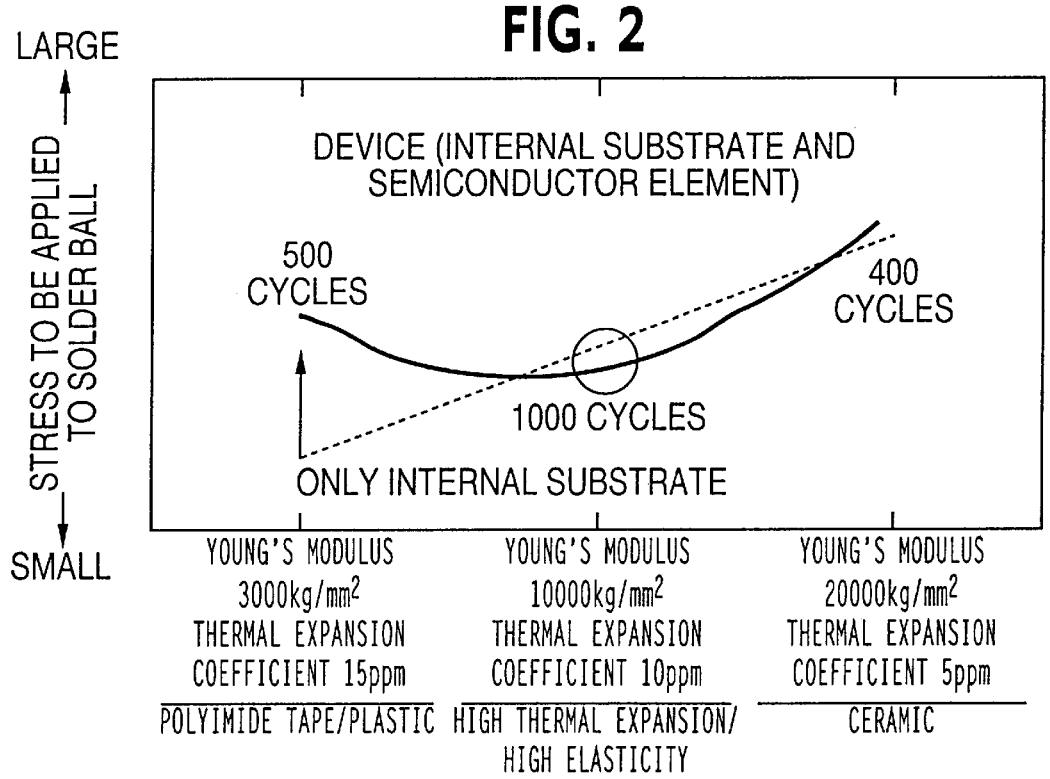
FIG. 2 is a diagram illustrating stress applied to a bump employed in the first embodiment shown in FIG. 1.

Referring to FIG. 2, a description will next be made of stress applied to each solder ball and temperature cycle characteristics thereat at the time that the internal substrate and the external substrate 9 are used, as compared with the case in which a ceramic substrate or a polyimide tape, or a plastic substrate is used.

Now, ones commonly used in all and each of which has a Young's modulus of 3000 kg/mm$^2$ and a thermal expansion coefficient of 15 ppm, are used as for the external substrate 9.

When the ceramic substrate having a Young's modulus of 20000 kg/mm$^2$ and a thermal expansion coefficient of 5 ppm is used as the internal substrate, the difference in thermal expansion coefficient between the ceramic substrate and the external substrate 9 is large. Therefore, the solder balls are apt to be subjected to or undergo stress. The internal substrate has only about 400 cycles as temperature cycles.

On the other hand, since a polyimide tape having the same characteristic as that for the external substrate 9, and an internal substrate composed of plastic are identical in thermal expansion coefficient if singly used, no stress is applied to the solder balls 7. However, since the internal substrate is actually used as a part of the semiconductor device, it is electrically and mechanically joined to the semiconductor element 1. Further, since the internal substrate is normally thin as 0.3 mm and soft or flexible as a Young's modulus of 3000 kg/mm$^2$, the thermal expansion coefficient of the internal substrate approaches a thermal expansion coefficient of 3 ppm of the semiconductor element 1 as for the semiconductor device. Thus, the difference in thermal expansion coefficient between the internal substrate and the external substrate 9 becomes large and hence the solder balls are apt to be subjected to stress. Therefore, the internal substrate has only about 500 cycles as the temperature cycles.

Now, a high thermal expansion/high elastic substrate having a Young's modulus of about 10000 kg/mm$^2$ including a characteristic value between these two, i.e., which is hard to some degree, and having a thermal expansion coefficient close to that for the external substrate 9 to some degree, e.g., about 10 ppm is used. As a result, the stress to be applied to the solder balls 7 can be lowered. Using such an internal substrate can provide temperature cycles up to 1000 cycles.

Figure 3:
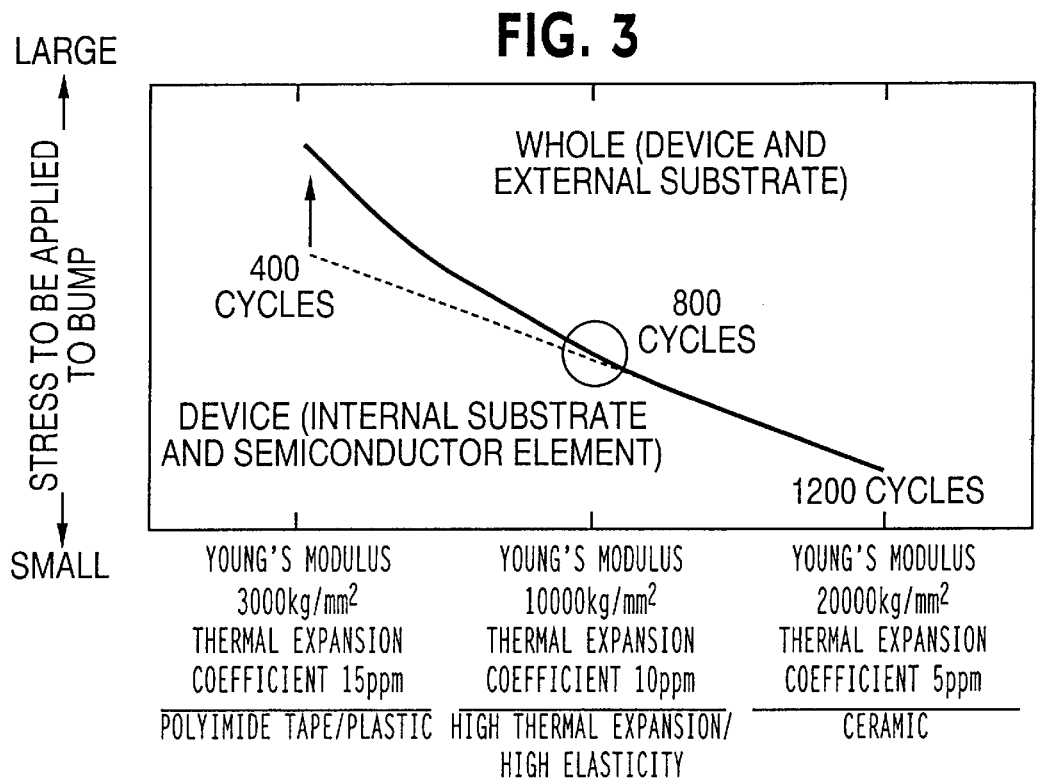
FIG. 3 is a diagram showing stress applied to a solder ball employed in the first embodiment shown in FIG. 1.

Stress applied to each bump electrode 2 and its temperature cycle characteristic will next be described with reference to FIG. 3.

When the polyimide tape having the same characteristic as that for the external substrate 9 or the internal substrate composed of plastic is used, the difference in thermal expansion coefficient between the internal substrate and the semiconductor element 1 becomes large and hence the bumps are apt to undergo stress. Further, the internal substrate is affected even by the thermal expansion coefficient of the external substrate 9 and has only about 400 cycles as the temperature cycles.

When ceramic is used as the internal substrate, it is effective for stress applied to each bump and has only about 1200 cycles as the temperature cycles. However, the stress applied to each solder ball is large as described above.

Next, when an internal substrate having a Young's modulus of about 10000 kg/mm$^2$ including a characteristic value between these two, i.e., which is hard to some degree, and having a thermal expansion coefficient close to that for the external substrate 9 to some degree, e.g., about 10 ppm is used as the internal substrate, the stress to be applied to the bumps can be lowered and the internal substrate can have temperature cycles up to 800 cycles.

Thus, since the internal substrate hard to some degree (corresponding to the Young's modulus of about 10000 kg/mm$^2$) and having the thermal expansion coefficient (of about 10 ppm) close to that for the external substrate 9 is used as the internal substrate, a semiconductor device can be implemented which is capable of reducing any stress applied to the solder ball junctions and the bumps.

Figure 4:
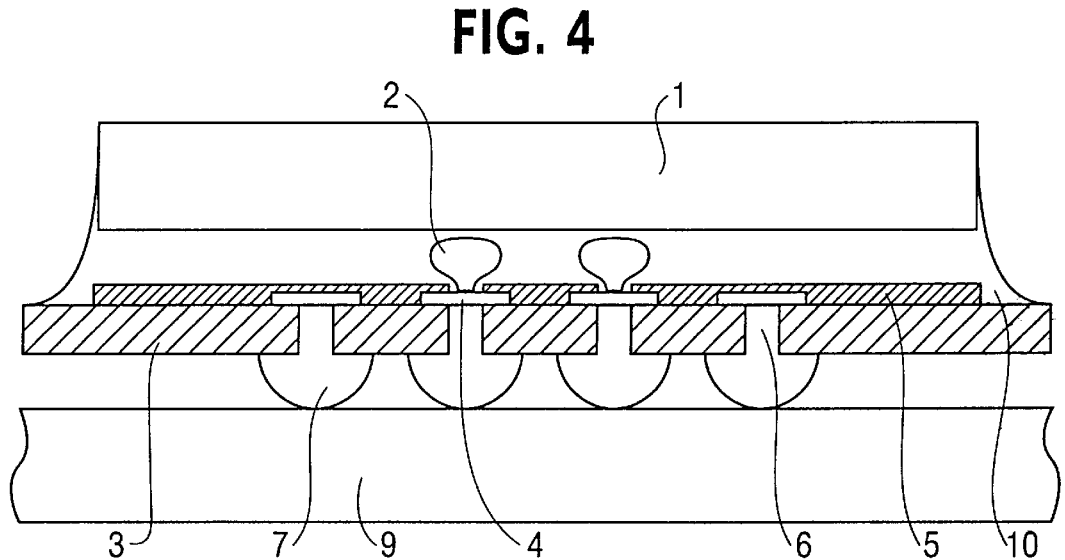
FIG. 4 is a diagram showing a second embodiment of the present invention.

A second embodiment of the invention of the present application will next be explained with reference to FIG. 4. The second embodiment is characterized in that a high elastic liquid resin 10 having Young's moduli ranging from 1500 to 2500 kg/mm$^2$ is used in place of a sealing resin having a Young's modulus of about 500 kg/mm$^2$, which is normally used as the resin charged between the semiconductor element 1 and the internal substrate 3. Using the sealing resin having such Young's moduli can provide a further reduction in the stress to be applied to each bump.

A process of manufacturing a semiconductor device according to the second embodiment of the present application will next be described.

A semiconductor element 1 having bump electrodes 2 on a circuit forming surface, and an internal substrate 3 having circuit patterns 4 composed of copper or the like, which are formed over one surface of the internal substrate 3, and through holes 6 extending from one surface to the other surface thereof, are first prepared. Further, the bump electrodes 2 of the semiconductor element 1 and the circuit patterns 4 of the internal substrate 3 are electrically connected to each other.

Next, the resin 10 is injected and cured between the semiconductor element 1 and the internal substrate 3. After the curing of the resin 10, solder balls 7 are put into their corresponding through holes 6 extending through the internal substrate 3, so that the semiconductor device according to the second embodiment can be obtained. Thereafter, the semiconductor device is placed on an external substrate 9 and joined to the external substrate 9 by the solder balls 7.

Figure 5:
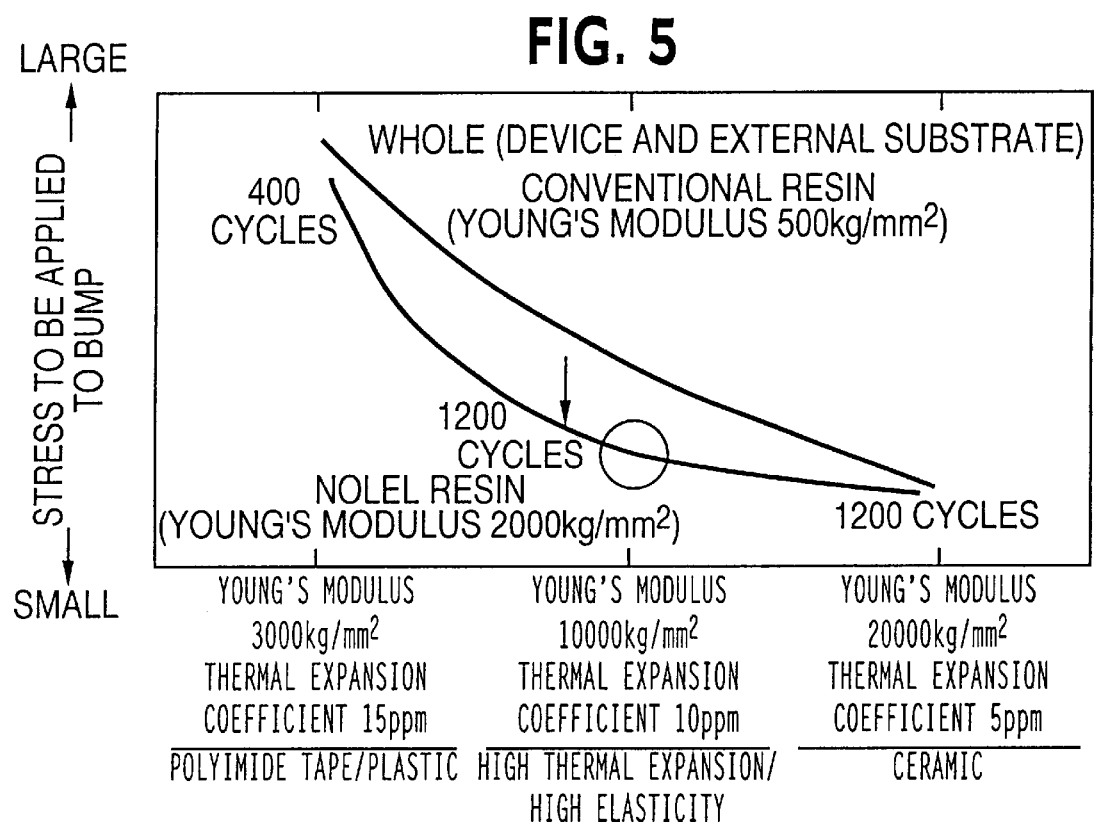
FIG. 5 is a diagram illustrating stress applied to a bump employed in the second embodiment shown in FIG. 2.

The manner of stress applied to the solder balls 7 and results of actual temperature cycle characteristics will next be described with reference to FIG. 5.

When a ceramic substrate having a Young's modulus of 20000 kg/mm$^2$ and a thermal expansion coefficient of 5 ppm is used as the internal substrate, the thermal expansion coefficient of the ceramic substrate is close to that of the semiconductor element 1 and hence the bump electrodes 2 are hard to undergo stress without regard to the sealing resin. Therefore, the present substrate has about 1200 cycles as the temperature cycles.

When a high elastic resin having a Young's modulus of about 2000 kg/mm$^2$ is used where a polyimide tape having the same characteristic as that for the external substrate 9 or a substrate such as plastic or the like is used as the internal substrate, the temperature cycles reach 400 cycles. Thus, the use of the high elastic resin becomes equivalent to the use of a commonly-available resin having a Young's modulus of about 500 kg/mm$^2$.

On the other hand, when an internal substrate having a Young's modulus of 10000 kg/mm$^2$ and a thermal expansion coefficient of 10 ppm is used as the internal substrate, the temperature cycles reach about 1200 cycles. Thus, the temperature cycle characteristic is greatly improved as compared with the case in which one having a Young's modulus of about 500 kg/mm$^2$, which is equivalent to the commonly-used resin, is used. This is considered to be further hard to be affected by the thermal expansion coefficient of the external substrate 9.

Thus, when the internal substrate hard to some degree (having the Young's modulus of 10000 kg/mm$^2$) and having the thermal expansion coefficient (10 ppm) close to that for the external substrate 9 to some degree is used as the internal substrate and the high elastic liquid resin having the Young's modulus of 2000 kg/mm$^2$ is used as the sealing resin, any stress applied to the solder balls 7 and the bumps 2 can be reduced.

The temperature cycles related to the first and second embodiments referred to above will be summarized in FIG. 6. It is understood that when the internal substrate having the Young's modulus of 10000 kg/mm$^2$ and the thermal expansion coefficient of 10 ppm is used, the temperature cycle characteristic is greatly improved as compared with the use of other internal substrates as is apparent from FIG. 6. It is also understood that when the high elastic liquid resin having the Young's modulus of 2000 kg/mm$^2$ is used, the temperature cycles are greatly improved as 1200 cycles in internal connections between the semiconductor element and the internal substrate.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device for mounting on an external substrate having a given Young's modulus, said semiconductor device comprising:

a semiconductor chip having a main surface, said semiconductor chip including a plurality of bump electrodes formed on the main surface;

an elastic internal substrate having a first surface and a second surface opposite to the first surface, said internal substrate including a conductive pattern electrically connected to the bump electrodes and formed on the first surface, and a plurality of external electrodes formed on the second surface thereof, the external electrodes being electrically connected to the conductive pattern and adapted for mounting on the external substrate; and an elastic liquid resin covering the main surface of said semiconductor chip, the first surface of said internal substrate and the bump electrodes, wherein said internal substrate has a Young's modulus of about 8000 to 15000 kg/mm$^2$ which is larger than the Young's modulus of the external substrate.

2. A semiconductor device according to claim 1, wherein said internal substrate has a thermal expansion coefficient having a value which is close to a thermal expansion coefficient of the external substrate.

3. A semiconductor device according to claim 1, wherein said internal substrate has a thermal expansion coefficient of about 10 to 12 ppm.

4. A semiconductor device according to claim 3, wherein said external substrate has a thermal expansion coefficient of about 15 ppm.

5. A semiconductor device according to claim 1, wherein said resin has a Young's modulus of about 1500 to 3000 kg/mm$^2$.

6. A semiconductor device according to claim 1, wherein said resin has a Young's modulus of about 2000 kg/mm$^2$.

7. A semiconductor device according to claim 1, wherein the external electrodes are electrically connected to the conductive pattern via a plurality of through holes formed in said internal substrate.

8. A semiconductor device according to claim 1, wherein the external substrate has a Young's modulus of about 3000 kg/mm$^2$.

9. A semiconductor device according to claim 1, wherein said internal substrate has a Young's modulus of about 10000 kg/mm$^2$.

10. A semiconductor device, comprising:

a semiconductor chip having a main surface thereof, said semiconductor chip including a plurality of bump electrodes formed on the main surface;

a thermal expansion/high elastic substrate having a first surface and a second surface opposite to the first surface, said substrate including a conductive pattern formed on the first surface, an insulating layer formed on the conductive pattern and the first surface of said substrate and a plurality of external electrodes formed on the second surface thereof, the insulating layer has an opening to expose the conductive pattern so that the conductive pattern is electrically connected to the bump electrodes, the external electrodes being electrically connected to the conductive pattern; and a high elastic liquid resin covering the main surface of said semiconductor chip, the first surface of said substrate and the bump electrodes, wherein said substrate has a Young modulus of about 8000 to 15000 kg/mm$^2$.

11. A semiconductor device according to claim 10, wherein said semiconductor device is mounted on an external substrate having a plurality pads so that the external electrodes are electrically connected to the pads of the external substrate.

12. A semiconductor device according to claim 11, wherein the external substrate has a thermal expansion coefficient of about 15 ppm.

13. A semiconductor device according to claim 11, wherein said substrate has a thermal expansion coefficient having a value in the neighborhood of a thermal expansion coefficient of the external substrate.

14. A semiconductor device according to claim 11, wherein the external substrate has a Young modulus of about 3000 kg/mm$^2$.

15. A semiconductor device according to claim 10, wherein said substrate has a thermal expansion coefficient of about 10 to 12 ppm.

16. A semiconductor device according to claim 10, wherein said resin has a Young modulus of about 1500 to 3000 kg/mm$^2$.

17. A semiconductor device according to claim 16, wherein said resin has a Young modulus of about 200 kg/mm$^2$.

18. A semiconductor device according to claim 10, wherein the external electrodes are electrically connected to the conductive pattern via a plurality of through holes formed in said substrate.

19. A semiconductor device according to claim 10, wherein said substrate has a Young modulus of about 10000 kg/mm$^2$.

20. A semiconductor device for mounting on an external substrate having a Young's modulus of about 3000 kg/mm$^2$, comprising:

a semiconductor chip having a main surface thereof, said semiconductor chip including a plurality of bump electrodes formed on the main surface;

an internal substrate formed of material having a Young's modulus of about 8000 to 15000 kg/mm$^2$, said internal substrate having a first surface and a second surface opposite to the first surface, said internal substrate including a conductive pattern electrically connected to the bump electrodes formed on the first surface and a plurality of external electrodes formed on the second surface thereof, the external electrodes being electrically connected to the conductive pattern and mounted on the external substrate; and a high elastic liquid resin covering the main surface of said semiconductor chip, the first surface of said internal substrate and the bump electrodes.

21. A semiconductor device according to claim 20, wherein the material has a thermal expansion coefficient having a value in the neighborhood of a thermal expansion coefficient of the external substrate.

22. A semiconductor device according to claim 20, wherein the material has a thermal expansion coefficient of about 10 to 12 ppm.

23. A semiconductor device according to claim 20, wherein said external substrate has a thermal expansion coefficient of about 15 ppm.

24. A semiconductor device according to claim 20, wherein said resin has a Young modulus of about 15000 to 300 kg/mm$^2$.

25. A semiconductor device according to claim 24, wherein said resin has a Young modulus of about 2000 kg/mm$^2$.

26. A semiconductor device according to claim 20, wherein the external electrodes are electrically connected to the conductive pattern via a plurality of through holes formed in said internal substrate.

27. A semiconductor device according to claim 20, wherein said material has Young modulus of about 10000 kg/mm$^2$.

* * * * *